United States Patent [19]

Ingalsbe

[11] Patent Number: 4,878,848

[45] Date of Patent: Nov. 7, 1989

[54] 110 BLOCK ADAPTER

[75] Inventor: David L. Ingalsbe, Hastings, Minn.

[73] Assignee: Independent Technologies, Inc., Omaha, Nebr.

[21] Appl. No.: 219,561

[22] Filed: Jul. 14, 1988

[51] Int. Cl.[4] .................... H05K 1/00

[52] U.S. Cl. .................... 439/76; 439/676; 439/638

[58] Field of Search .................... 439/55, 76, 79, 620, 439/638–655, 676

[56] References Cited

U.S. PATENT DOCUMENTS

| | | | |
|---|---|---|---|
| 3,833,839 | 9/1974 | Debaight | 439/76 |
| 4,392,701 | 7/1983 | Weidler | 439/76 |
| 4,618,196 | 10/1986 | Muzslay | 439/76 |
| 4,756,695 | 7/1988 | Lane et al. | 439/76 |

FOREIGN PATENT DOCUMENTS

| | | | |
|---|---|---|---|
| 8303817 | 10/1983 | PCT Int'l Appl. | 439/76 |

*Primary Examiner*—David Pirlot
*Attorney, Agent, or Firm*—Anthony G. Eggink

[57] ABSTRACT

The present invention provides a unitary, compact telecommunications interface adapter system. The adapter system comprises a bifurcated housing structure enclosing a modular connector and associated elements. The housing structure has a plug end constructed and arranged for connection to a 110-type telecommunications interface. The adapter further has an internal printed circuit board interface between the modular connector and a plurality of contact blades which are connected to and extend horizontally beyond the perimeter of the printed circuit board through channels so that they are exposed for contact outside the housing structure at the plug end. The telecommunications interface adapter system additionally comprises a support structure which has top and bottom spacially parallel extension members integrally formed with the housing structure at the plug end and disposed respectively above and below the contact blades.

14 Claims, 5 Drawing Sheets

110 BLOCK ADAPTER

BACKGROUND OF THE INVENTION

This invention relates to electrical connector apparatus and more particularly to telephone industry electrical adapter devices. The device of this invention is particularly useful for electrically connecting a telephone industry 110-type Block or terminal to a modular plug.

The 110 Block Adapter of the present invention provides a means of electrically connecting and adapting a 110 Block to a modular jack for testing new or existing telecommunications industry wiring installations. The 110 Block Adapter further provides a means of installing new telephone equipment via connection to a 110 Block. The 110 Block Adapter is usable on 110 Blocks for adaptation to a modular jack which receives either 1, 2, 3, or 4 pair modular plugs.

In accordance with present telecommunications industry practice, telephone networks are divided into a telephone company side and a telephone customer side. The division between the two sides of the network is referred to as a demarcation point. It is at this point that the responsibility for installation and maintenance of telephone company and customer equipment is divided. The demarcation point typically comprises a multiple wire, plug-type terminal or interface. An example of such an interface is the 110 Block.

The 110 Block is connected to and terminates the telephone company's line or lines in or at the customer's premises. This typically occurs at either the entrance cable leading into the premises or, for example, in the case of a multiple story building, at the end of a riser cable extending from the entrance cable (located on the ground floor) to an upper floor. The 110 Block provides connections for customer supplied single line or multiple line network equipment depending upon the customer's needs.

The typical 110-type Block or interface comprises a housing structure having multiple longitudinal rows of electrical contacts. The individual rows of electrical contacts may be comprised of several individual clip-on style segments. Each such segment has a plurality, for example 8, of elongated, scissors-type, split or forked electrical contacts arranged side by side in a planar configuration and uniformly spaced. The contacts are arranged in a thin, relatively flat nonconductive housing which exposes both ends of each contact. At one end of the housing, the contacts are exposed for hook-up with premises interconnect wiring. At the opposite end, the contacts are exposed for contact with an adapter or other customer provided telecommunications equipment. At this end, the housing further includes either an elongated guidepost structure with a tapered end (pair-post) or a shorter guidepost structure with a generally square end (short post) between contacts. Each such structure is cantilevered from the main body of the housing. The pair-posts and short posts form interstitial sockets in which the split contacts are located. The pair-posts and short posts guide the incoming conductors of an external adapter or other telecommunications equipment to the respective sockets for connection with the split contacts. The pair-post structures are disposed between each side by side related pair of contacts (each pair of contacts corresponding to one telecommunications line) while the short post structures separate the related pairs. On the top surfaces of both the pair-posts and the short posts are rounded nipples. Only the pair-post bottom surfaces have such nipples. Additionally, the bottoms of the short posts are longitudinally notched; the notches being open to the bottom and also at their outwardly extended end.

The expansion of telephone networks over time, under the current industry practice, has resulted in extensive, complex and variable interface and interconnect wiring installations. This has made cable identification and trouble isolation a more difficult and time consuming task for repair and installation technicians. Thus, there has arisen a need for an apparatus which simplifies the connection of test or other telephone equipment and which utilizes modular connectors comprising male-type plugs and female-type jacks. In the past, connector devices have been used and proposed to adapt demarcation point connections as well as other connections with modular plugs or jacks. However, these devices have proven to be complex, expensive, unreliable, bulky, and difficult to use. And, these devices have generally been unuseable with 110-type Blocks.

The 110 Block Adapter of the present invention provides an adapter which overcomes the shortcomings, problems and disadvantages of the prior art. The invention provides a compact, durable, and reliable adapter which is simple and easy to use. The 110 Block Adapter is usable on temporary or permanent telephone installations. The device is usable to provide connections to 110 Blocks, and to either 1, 2, 3 or 4 pair modular plugs. It may be used for either troubleshooting or installation purposes. The device also provides a means of establishing temporary cross connects, half-taps for cut over purposes, and conversions to a modular patch panel.

SUMMARY OF THE INVENTION

The device of the present invention provides a unitary and compact telecommunications interface adapter system. The adapter system comprises a modular connection means, such as a modular jack, and a housing structure connected to the modular jack. The housing structure has a central cavity and a generally rectangular, planar plug end extended from the central cavity for connection to the telecommunications interface. The adapter further has a plurality of electrical contact blades and means to electrically connect the modular jack and the contact blades. The modular jack and the electrical connection means are enclosed within the central cavity.

Preferably, the housing structure is a bifurcated or two-part structure having a top portion and a bottom portion which are constructed of nonconductive fiberglass reinforced plastic. The top and bottom portions are coupled via a sonic fusion process. The electrical connection means is preferably a printed circuit board communicatively connected to the modular jack and the contact blades. The contact blades are preferably planar and extend horizontally beyond the perimeter of the printed circuit board through channel means so that they are exposed for contact outside the central cavity.

The telecommunications interface adapter system preferably and additionally comprises means for supporting the adapter system in operative connection to the telecommunications interface. The support means comprises top and bottom spacially parallel extension members integrally formed with the housing structure at the plug end and disposed respectively above and below the contact blades.

These and other benefits of this invention will become clear from the following description by reference to the drawings.

DESCRIPTION OF THE PREFERRED EMBODIMENT

The 110 Block adapter device of the present invention is used to adapt an AT&T 110-type Block or interface to a modular jack. The device is useable on temporary or permanent telephone installations to test from 110 Blocks, to provide a modular cross-connecting system, to provide for equipment conversions, or to convert a 110 Block to a modular patch panel. The adapter device is compact; thus, multiple adapters may be used simultaneously on a single 110 Block. Also, the adapter device is reusable.

Figure 1:
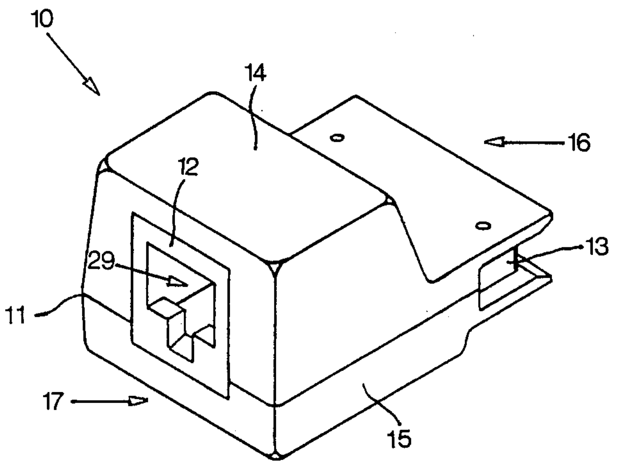
FIG. 1 is a perspective view of the 110 Block Adapter of the present invention.
Figure 2:
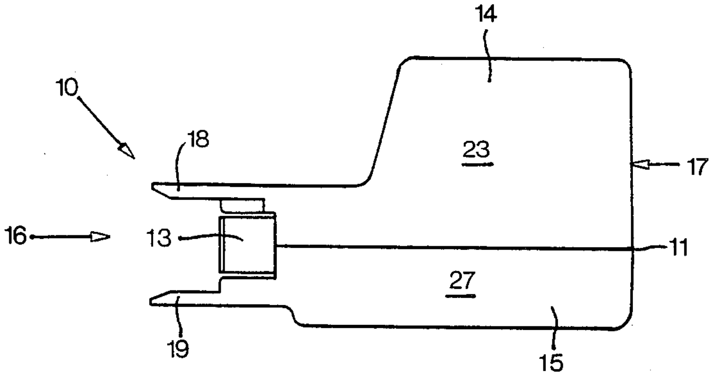
FIG. 2 is a side view of the 110 Block Adapter of this invention.

Referring to FIGS. 1 and 2, the unitary adapter device 10 is contained in a compact housing or case 11 which is preferably composed of molded, fiberglass reinforced ABS plastic, and has an internal modular jack assembly 12, and a plurality of partially enclosed contact blades 13 which make electrical connections to a 110 Block with repeated use. The housing 11, as shown in the drawings, is comprised of an upper body member 14 and a lower body member 15 which mate to form the housing structure 11. The upper and lower body members or portions 14 and 15 are joined preferably via a sonic fusion process known in the art. This housing structure 11 configuration and method of assembly is efficient and easy to manufacture, although additional configurations and methods are within the purview of this invention, for example, a one-piece structure formed via a molding process. The modular jack 12 is exposed at the posterior end 17 of the housing structure 11 for connection to the modular plug of a test apparatus or the like. The contact blades 13 are exteriorly exposed at the opposite or anterior end 16 for direct connection to a 110 Block or terminal.

Figure 3:
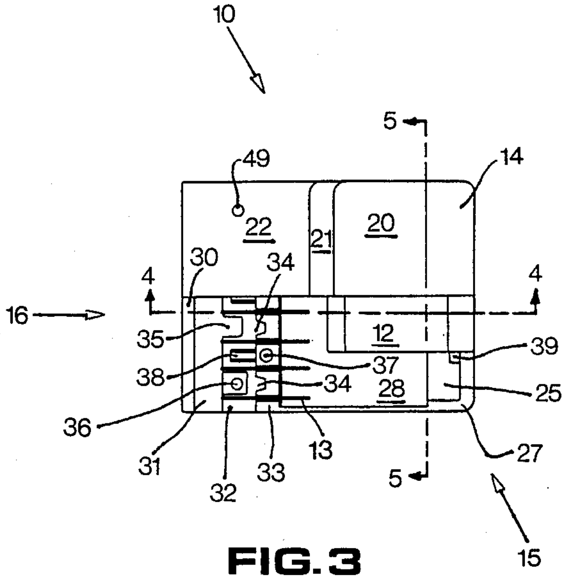
FIG. 3 is a top plan view of the 110 Block Adapter of this invention, having its upper body member partially separated to show its interior.
Figure 5:
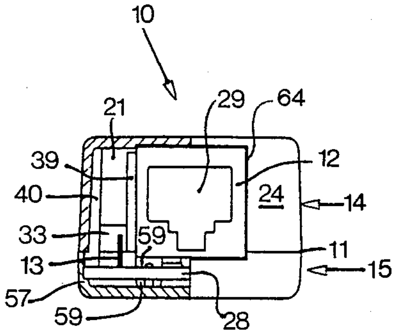
FIG. 5 is a posterior view of the 110 Block Adapter shown in FIG. 3, partially in cross section along line 5—5.
Figure 4:
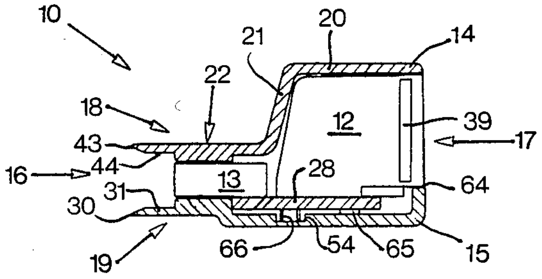
FIG. 4 is a cross-sectional view of the 110 Block Adapter shown in FIG. 3, taken along line 4—4.

The housing structure 11 provides a compact structure which is easily connected or disconnected by the operator using one hand. The enlarged portion of posterior end 17 is generally cube-shaped. FIGS. 3, 4 and 5 show the housing structure 11 having a flat top surface 20, a sloping surface 21, and an extended, rectangular, and generally flat plug extension 22 at its anterior end 16. The plug extension or receptacle 22 terminates in opposing, planar, spacially separated, and parallel lip members 18 and 19 forming an interspace. In use, the plug extension 22 is connectable to a 110 Block.

The housing structure 11 has a hollow internal cavity. The modular jack assembly 12 and contact blades 13 are enclosed within the internal cavity and are communicatively connected to one another via a printed circuit board (PCB) interface 28. The printed circuit board 28 is disposed adjacent the bottom surface 25 of the housing structure 11 internal cavity in a parallel fashion. As further shown in the drawings, the interior dimensions of the housing structure 11 internal cavity are substantially coextensive with the dimensions of the modular jack assembly 12, contact blades 13 and printed circuit board 28. The jack aperture 29 of the modular jack assembly 12 is exposed for connection to a modular plug at the posterior end 17 of the housing structure 11 via an aperture 64 in the housing structure 11. The contact blades 13 are oriented so that they extend away from the modular jack assembly 12 and in the direction opposite that of the housing structure aperture 64. The contact blades 13 are exposed outside the internal cavity at the anterior end 16 and in the interspace between the top and bottom lip members 18 and 19.

Figure 6:
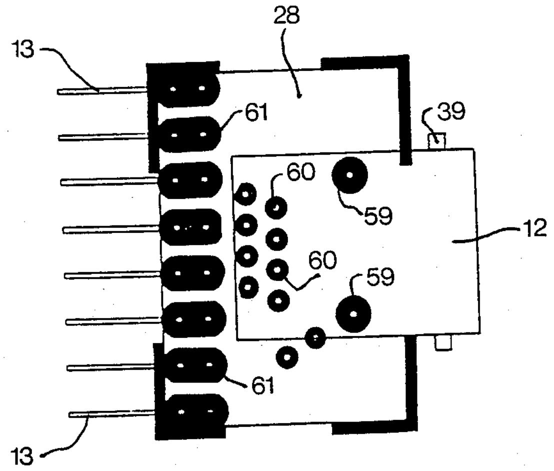
FIG. 6 is a top view of the printed circuit board of the 110 Block Adapter of this invention, and also showing the connection of the contact blades and modular jack assembly thereto.

FIG. 6 shows the orientation of the modular jack assembly 12 and contact blades 13 with respect to the printed circuit board 28. The modular jack assembly 12 is a standard jack as known in the art and has a flangeless housing with a panel stop 39. The modular, female-type, plug-receiving aperture 29 is oriented parallel to the PCB 28. The jack housing is preferably composed of flame retardant polyester thermoplastic and designed for direct mounting on the PCB 28. The modular jack assembly 12 preferably has 8 bent-wire contacts, but may have 2, 4 or 6 contacts depending upon the adapter application. The contact wires are preferably constructed of phosphor bronze alloy plated with Gold on the contact areas, Tin-Lead on the solder tails, and Nickle on the entire contact surface. An example of such a modular jack assembly is that manufactured by AMP Incorporated, Harrisburg, Pa. The modular jack assembly 12 provides a simple and efficient means of connection to telecommunications equipment, data transmission equipment or related testing and repair equipment.

The modular jack assembly 12 is connected to the printed circuit board 28 preferably via snap-in type connection posts 65 (shown in FIGS. 4 and 5) which extend from the bottom of the modular jack assembly 12 and through apertures 59 in the surface of the printed circuit board 28. Pin-type electrical solder tails 66 (see FIG. 4) also extend from the bottom of the modular jack assembly 12 and are communicatively connected to the 60 in the PCB 28. The modular jack assembly 12 extends laterally beyond the outer dimension of the printed circuit board 28 on one side for extension through the aperture 64 of the housing structure 11.

Figure 7:
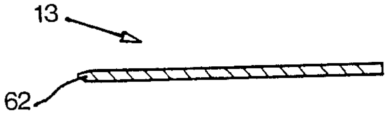
FIG. 7 is a cross-sectional view of the contact blade of the 110 Block Adapter of this invention.
Figure 8:
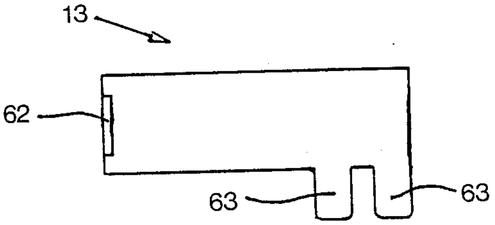
FIG. 8 is a top view of the contact blade shown in FIG. 7.
Figure 14:
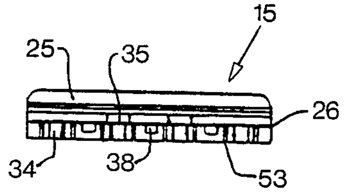
FIG. 14 is an opposite side view of the exterior of the housing structure bottom portion, showing the contact blade slots.
Figure 12:
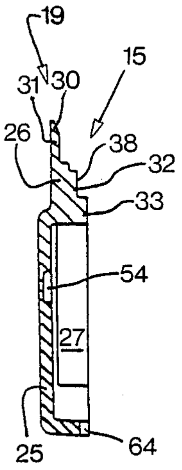
FIG. 12 is a cross-sectional view of the housing structure bottom portion shown in FIG. 10, taken along line 12—12.
Figure 10:
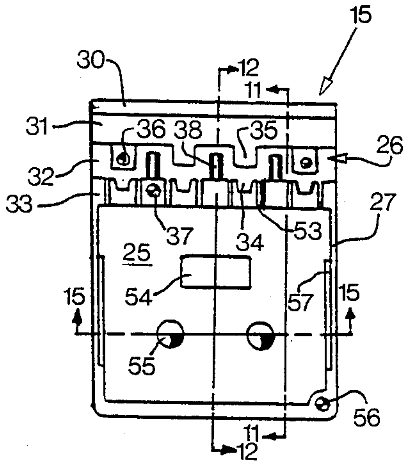
FIG. 10 is a top view of the interior of the housing structure bottom portion shown in FIG. 9.
Figure 11:
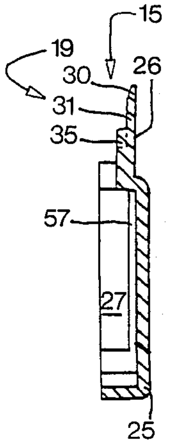
FIG. 11 is a cross-sectional view of the housing structure bottom portion shown in FIG. 10, taken along line 11—11.
Figure 9:
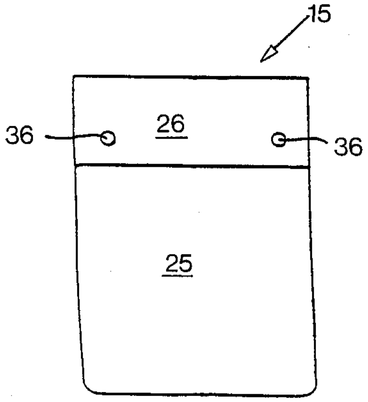
FIG. 9 is a top view of the exterior of the housing structure bottom portion of the 110 Block Adapter of this invention.
Figure 13:
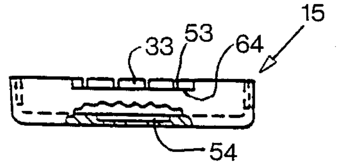
FIG. 13 is a side view of the exterior of the housing structure bottom portion, partially in cross section.
Figure 15:
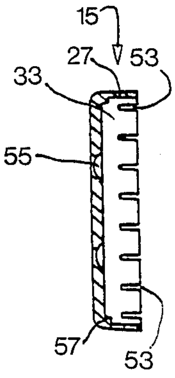
FIG. 15 is a cross-sectional view of the housing structure bottom portion shown in FIG. 10, taken along line 15—15.
Figure 20:
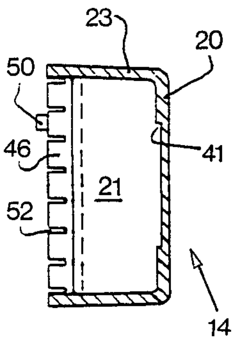
FIG. 20 is a cross-sectional view of the housing structure top portion shown in FIG. 17, taken along line 20—20.
Figure 22:
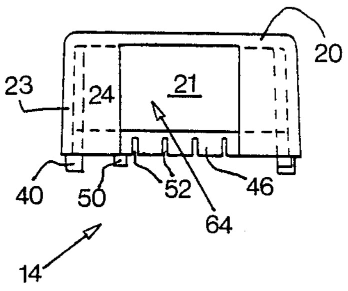
FIG. 22 is a side view of the exterior of the housing structure top portion showing the modular plug aperture.
Figure 18:
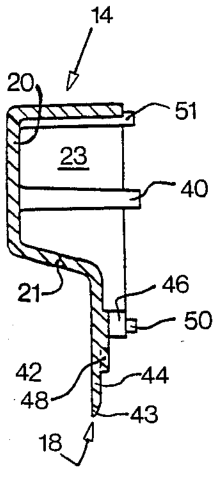
FIG. 18 is a cross-sectional view of the housing structure top portion shown in FIG. 17, taken along line 18—18.
Figure 17:
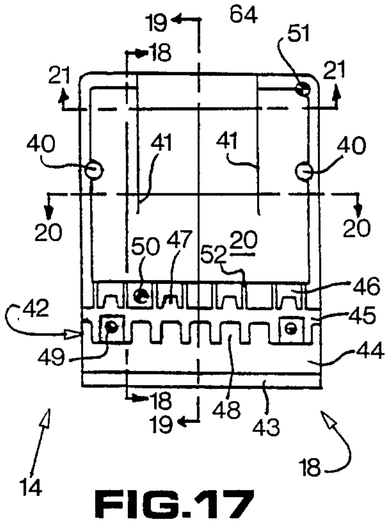
FIG. 17 is a top view of the interior of the housing structure top portion shown in FIG. 16.
Figure 19:
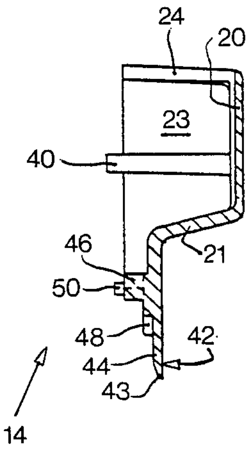
FIG. 19 is a cross-sectional view of the housing structure top portion shown in FIG. 17, taken along line 19—19.
Figure 21:
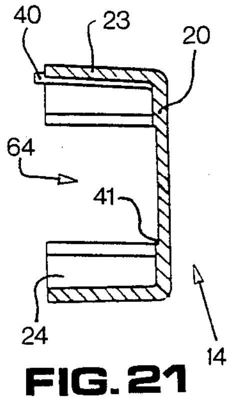
FIG. 21 is a cross-sectional view of the housing structure top portion shown in FIG. 17, taken along line 21—21.
Figure 23:
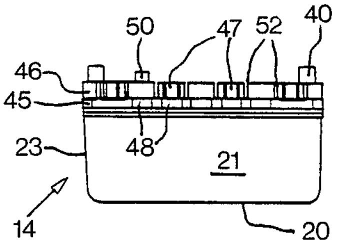
FIG. 23 is an opposite side view of the exterior of the housing structure top portion showing the contact blade slots.
Figure 16:
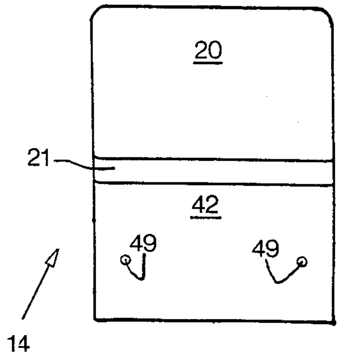
FIG. 16 is a top view of the exterior of the housing structure top portion of the 110 Block Adapter of this invention.

Referring also to FIGS. 7 and 8, each contact blade 13 has a generally rectangular configuration, being slightly elongated and preferably flat or planar. Each blade 13 has a tapered contact tip 62 at one end and one or more blade posts 63 at its other end. The blade posts 63 extend from a blade 13 edge at a generally right angle to the contact tip 62. The contact blades 13 are preferably constructed of 0.015 inch (0.38 mm) thick spring-temper phosphor bronze alloy plated with Nickle, bright Tin, r Nickle/Gold. Such compositions yield desirable and repeatable electrical connection with minimum resistance for low voltage telecommunications applications. FIG. 6 shows eight (8 contact blades 13 disposed along one side of the rectangular printed circuit board 28, opposite the modular jack assembly 12, and mounted to the edge thereof at contact points 61. Each contact point 61 comprises a pair of apertures in the PCB 28 which receive the blade posts 63 and are preferably secured via solder. The contact points 61 are communicatively connected to the connection apertures 60 via the conductive network of the PCB 28. The contact blades 13 extend from the outer edge of the printed circuit board 28 in a parallel fashion, each being uniformly spaced from one another at a predetermined distance corresponding to the spacing of 110 Block electrical contacts. Further, the contact blades 13 are aligned perpendicular to the plane of the surface of the printed circuit board 28 so that they lie on edge approximately 0.16 inches (4.06 mm) in height. The vertically aligned contacts 13 are inserted into the sockets of the 110 Block and between the split fingers of the 110 contacts.

FIGS. 9 through 15 show the lower or bottom member 15 of the housing structure 11. The lower member 15 has a rectangular, generally flat bottom or exterior surface 25 and a slightly recessed (from its bottom), flat and generally rectangular plug extension 26 which extends outwardly from one end of the bottom portion 25. The top or interior surface of the lower member 15 has a side wall 27 consisting of three elevated wall portions which surround the floor surface 25 and form a shallow, open, and generally flat, interior cavity. In the area of the lower member 15 corresponding with the extension portion 26, is a partition segment or ridge 33, a ridge or outcrop structure 32, a flat lip surface 31 and a beveled lip edge 30. The partition segment 33 has a vertical dimension generally equivalent to that of the side wall 27 and further defines and encloses the lower member 15 cavity. The ridge structure 32 extends laterally, slightly beyond the partition segment 33, and has a vertical dimension slightly less than that of the partition segment 33. The interior flat surface 31 and beveled edge 30 extend outwardly from the ridge structure 32. These elements generally define the lip 19 of the extension portion 26.

A plurality of apertures and/or notches 34–36, 38 and 53 are disposed in the ridge structure 32 and partition segment 33 of the lower member 15. These apertures and/or notches 34–36, 38 and 53 are disposed to correspond with complementary apertures and/or notches in the upper member 14 to provide connection, alignment, and communication functions while the adapter device 10 is in its operative connection with a 110 Block. These apertures and/or notches 34–36, 38 and 53 are described in detail below. Additionally, a housing alignment and connection recess 37 is shown to be disposed in the partition segment 33 to receive a complementary connection post of the upper member 14 for connection and alignment of the two members 14 and 15. A further connection recess 56 is disposed in preferably a posterior corner of a wall portion 27 of the lower member 15 to receive a complementary connection post of the upper member 14.

The printed circuit board 28 is disposed within the boundaries of the wall portions 27 and the partition segment 33, and adjacent and parallel to the cavity floor 25. The cavity floor 25 has a horizontal dimension substantially coextensive with that of the printed circuit board 28. Printed circuit board ledgers 57 are disposed on opposing wall portions 27. The printed circuit board ledgers 57 are shown to be thin, elongated strips which extend outwardly from the two wall members 27 and are raised slightly vertically from the cavity floor 25. The printed circuit board ledgers 57 extend linearly from the posterior corners of the lower member 15 to a point near and just short of the partition segment 33. The printed circuit board 28 is supported by the printed circuit board ledgers 57 so that it is raised slightly above the cavity floor 25. Thus, the conductive network of the printed circuit board 28 is elevated from contact with the cavity floor 25. A solder tail recess 54 of a generally rectangular horizontal dimension and a vertical dimension of approximately 2 mm. is disposed approximately in the center of the cavity floor 25. In this alignment, the solder tail recess 54 is disposed so as to receive the solder tails 66 of the modular jack assembly 12 as they extend through the printed circuit board 28 and further from its bottom surface. Additionally, connection post recesses 55 are similarly disposed on the cavity floor 25 so that they correspond with the modular jack connection posts 65 and receive the bottom ends of such posts 65 in their extended positions through the printed circuit board 28.

As previously discussed, the upper or top member 14 is connected to the lower member 15 to provide an internal cavity for housing the adapter 10 components. The configuration of the upper member 14 covers the modular jack assembly 12 and portions of the contact blades 13. Referring to FIGS. 6–23, a pair of side walls 23 together with a rear wall 24 define the horizontal dimensions of such cavity, while the interior sides of the top surface 20 and sloping surface 21 generally define its top vertical dimension. Anterior to the sloping surface 21 is a flat, horizontal and generally rectangular plug extension 42. The plug extension 42, when operatively aligned with the plug extension 26 of the lower member 15, forms the composite plug end 22. Located on the plug extension 42 are a partition segment or ridge 46, a ridge member 45, a flat lip surface 44, and a beveled lip edge 43. A plurality of apertures and/or notches 47–49, and 52 are disposed in the upper member 14 at the ridge member 45 and the partition segment 46. These notches and/or apertures 47–49 and 52 correspond to, and cooperate with, complementary notches and/or apertures 34–36, 38 and 53 in the lower member 15 as previously discussed.

A modular jack recess area 41 is disposed in the bottom or interior surface 20 of the upper member 14 and extends generally horizontally from the jack aperture 64 to the sloping surface 21. The jack recess 41 has a vertical dimension of approximately 0.2 mm. in the top surface 20, increasing to approximately 2 mm. in the interior side of the sloping surface 21. The horizontal dimensions of the jack recess 41 are generally coextensive with that of the top surface of the modular jack assembly 12. The jack recess 41 receives the modular jack assembly 12 in its operative containment by the upper member 14.

Printed circuit board alignment posts 40 are integrally formed with the interior side walls 23 of the upper member 14. The PCB alignment posts 40 are generally columnar in shape and extend from the interior of the top surface 20 along the side walls 23, and slightly beyond the lower edge of the side walls 23. The bottom edges of the PCB alignment posts 40 contact the top surface of the printed circuit board 28 and align it with respect to the remaining portions of the upper member 14 and with the operatively connected modular jack assembly 12. The function of the PCB alignment posts 40 is to align and restrain vertical movement of the printed circuit board 28 within the housing structure 11. Additionally, housing alignment and connection posts 50 and 51 are disposed at predetermined locations on the upper member 14. The connection posts 50 and 51, in their operative connection, align with and are connected to the connection notches or recesses 37 and 56 in the lower member 15.

The merged upper and lower members 14 and 15 provide a unitary housing structure 11 for containing and aligning the modular jack assembly 12, the PCB 28, and the contact blades 13. In their connected, operative positions, the various elements of the upper and lower members 14 and 15 are aligned and cooperate with one another to provide a number of additional functional advantages. Specifically, beveled edge 43 is spacially and vertically aligned with beveled edge 30 to guide the connection of the adapter 10 to the 110 Block. The flat surface 44 is vertically aligned with flat surface 31 to stabilize and restrict vertical movement of the adapter device 10 when it is connected to a 110 Block. Ridge member 45 is vertically aligned with ridge member 32 to accommodate the complementary shape of the 110 Block in its mated location in the interspace between lip members 18 and 19, thereby insuring proper alignment and electrical connection of the adapter 10 to the 110 Block. The partition segment 46 is vertically aligned with partition segment 33 to provide a unitary partition between the housing structure 11 internal cavity and the open plug extension 22 interspace. The composite partition 46 and 33 aligns the extended contact blades 13 and further provides a receptacle structure for mating with the 110 Block.

As previously mentioned, the upper and lower members 14 and 15 have a plurality of cooperating apertures and/or notches which yield composite connection structures when the upper and lower members 14 and 15 are merged. For example, the four (4) pairs of cooperating and vertically aligned pair-post reception notches 34 and 47 receive and engage the pair posts of the 110 Block. Also, the blade slots 52 and 53 are aligned and cooperate to provide eight (8) unitary channels through the composite Partition 33 and 46 for extension of the contact blades 13 from the interior cavity of the housing structure 11 to the plug portion 22. And, the pair of connection bores 36 are vertically aligned and cooperate with the pair of connection bores 49 to engage the respective top and bottom connection nipples of the 110 Block, thereby securing the connection between the adapter 10 and the 110 Block. The device 10 further has three (3) alignment posts 38, located in the lower member 15, which mate with alignment notches of the 110 Block to ensure proper electrical connection and to prevent reversals and transpositions.

The overall structure of the anterior portion 16 or plug end 22 of the adapter device 10 is designed to provide a stable and reliable electrical connection to a 110 Block which is easy and quick to initiate or terminate. The plug extension 22 is vertically defined by the lip members 18 and 19, creating an interspace which terminates horizontally with the composite partition segment 33 and 46. The interspace has vertical and horizontal dimensions generally coextensive with those of the 110 Block segment to which the adapter 10 is connected. Thereby, the extension of the lip members 18 and 19 over the top and bottom surfaces of the inserted 110 Block restricts vertical movement of the adapter 10 and thus increases connection stability. The partition segment 33 and 46 provides a mating structure which complements the inserted face or side of the 110 Block. This mating structure aligns the contact blades 13, which extend horizontally through the composite blade channels 52 and 53, for electrical connection with the horizontal scissor contacts of the 110 Block.

In summary, the adapter device 10 of this invention is connected directly to a 110 Block by inserting the plug receptacle 22 on the 110 Block as previously discussed. Modular connections are then made via the jack aperture 29. The modular connection of the adapter 10 allows a user to conveniently install or repair telephone equipment from the 110 Block. It can also be used to test new cable installations or to isolate problems in telephone service. The device 10 additionally allows a user to modularly connect from a 110 Block to KEY and PBX common equipment or to connect directly to a set with a four-pair base cord. It also allows conversion of the 110 Block to a patch panel, thus enabling a user to change his own cross connects.

As many changes are possible to the embodiments of this invention utilizing the teachings thereof, the descriptions above, and the accompanying drawings should be interpreted in the illustrative and not the limited sense.

That which is claimed is:

1. A telecommunications interface adapter system for connecting a modular connector to a 110-type Block Terminal having a mating end, comprising:
- a. modular connection means having a plurality of contact wires;
- b. a housing structure enclosing said modular connection means and having a central cavity and a tapered plug end, said tapered plug end having receptacle means for connection to the mating end of the 110-type Block Terminal, said receptacle means further including channel means;
- c. a plurality of upstanding conductive blades extending from said central cavity through and disposed within said channel means of said receptacle means and extending to the exterior of said housing structure at said tapered plug end to expose a portion of each said blade for mating contact with the 110-type Block Terminal; and
- d. a printed board having means to electrically connect said contact wires of said modular connection means and said upstanding blades, said printed circuit board being located in said housing structure.

2. The telecommunications interface adapter system of claim 1, wherein said modular connection means is a modular jack assembly.

3. The telecommunications interface adapter system of claim 1, wherein said modular connection means and said electrical connection means are enclosed within said housing structure, said modular connection means being exposed for mating via an aperture in said housing structure.

4. The telecommunications interface adapter system of claim 1, wherein said plug end is generally rectangular, planar, and extended from said central cavity.

5. The telecommunications interface adapter system of claim 1, wherein said contact blades are constructed of hardened spring temper phosphor bronze alloy, coated with a substance selected from the group consisting of Nickle, Nickle/Gold, and bright Tin.

6. The telecommunications interface adapter system of claim 1, wherein said modular connection means has a connection port arranged spacially parallel to said printed circuit board, and wherein said contact blades extend from said printed circuit board opposite said connection port.

7. The telecommunications interface adapter system of claim 1, wherein said housing structure has means for supporting said electrical connection means in said central cavity.

8. The telecommunications interface adapter system of claim 1, wherein said housing structure has means for restraining vertical movement of said electrical connection means in said central cavity.

9. The telecommunications interface adapter system of claim 1, wherein said housing structure is a bifurcated structure having a top portion and a bottom portion.

10. The telecommunications interface adapter system of claim 9, wherein said housing structure is constructed of nonconductive fiberglass reinforced plastic, said top and bottom portions being coupled via a sonic fusion process.

11. The telecommunications interface adapter system of claim 1, further comprising means for supporting and stabilizing the adapter system in operative connection to the telecommunications interface.

12. The telecommunications interface adapter system of claim 11, wherein said support means comprises top and bottom spacially parallel extension members integrally formed with said housing structure at said plug end.

13. A telecommunications adapter for connecting a modular connector to the mating end of a 110-type block terminal comprising:
- a. a modular electrical connector having bent wire leads terminating in connection means;
- b. a printed circuit board communicatively connected to said modular connector via said connection means and having a conductive network;
- c. a plurality of planar contact blades mounted to said printed circuit board and being communicatively connected to said modular connector via said conductive network; and
- d. a housing structure having a central cavity enclosing said printed circuit board, said modular connector and said blades, a central aperture in said central cavity exposing said modular connector for connection, and a plug end portion exposing said contact blades outside said housing structure and being connectible to the 110-type block terminal, said plug end having a partition segment receptive of the mating end of the 110-type block terminal, said partition segment having a plurality of channels for extension of said blades from said central cavity, and means to restrict movement of the adapter when connected to the 110-type block terminal, said means to restrict movement including a pair of specially parallel lip members.

14. A unitary and compact adapter useable in the telecommunications field for connecting a modular connector to a 110-type Block Interface Terminal having electrical contacts, pair posts, connection nipples and alignment notches, said adapter comprising:
- a. a modular electrical jack assembly having bent wire leads terminating in solder tails;
- b. a rectilinear printed circuit board communicatively connected to said modular jack via said solder tails and having a conductive network;
- c. an array of separated and specially parallel contact blades vertically mounted to one side of said printed circuit board a predetermined distance from each other, said contact blades extending horizontally beyond said periphery of said printed circuit board, said contact blades being communicatively connected to said modular jack via said conductive network; and
- d. a housing structure having a central cavity enclosing said printed circuit board and said modular jack assembly, a posterior aperture in said central cavity exposing said modular jack for external connection, and a rectilinear and generally planar plug extension structure having a partition segment separating said central cavity from the exterior of the adapter and including an array of channels for extension of a portion of each said blade from the central cavity for communicative connection with the electrical contacts of the 110-type Block, notch means for reception of the pair posts of the 110-type Block, bore means for engagement of the connection nipples of the 110-type Block, and alignment posts for mating with the alignment notches of the 110-type Block, said plug extension structure further having a pair of specially parallel lip members creating an interspace enclosing said extended blade portions and being for stabilized engagement with the 110-type Block, said plug extension structure being connectible to the 110-type Block for electrical communication therewith.

* * * * *